United States Patent [19]

Goldsmith et al.

[11] 4,253,106
[45] Feb. 24, 1981

[54] GATE INJECTED FLOATING GATE MEMORY DEVICE

[75] Inventors: Norman Goldsmith, East Brunswick; Sheng T. Hsu, Lawrenceville, both of N.J.

[73] Assignee: RCA Corporation, New York, N.Y.

[21] Appl. No.: 86,313

[22] Filed: Oct. 19, 1979

[51] Int. Cl.³ .................................... H01L 29/78
[52] U.S. Cl. ............................. 357/23; 357/54
[58] Field of Search .......................... 357/23, 54

[56] References Cited

U.S. PATENT DOCUMENTS

| 3,649,884 | 3/1972 | Haneta | 317/235 R |
|---|---|---|---|
| 3,836,992 | 9/1974 | Abbas | 357/23 |
| 3,868,187 | 2/1975 | Masuoka | 357/23 |
| 4,057,820 | 11/1977 | Gallagher | 357/23 |
| 4,104,675 | 8/1978 | DiMaria | 357/54 |
| 4,115,914 | 9/1978 | Harari | 29/571 |
| 4,119,995 | 10/1978 | Simko | 357/23 |
| 4,162,504 | 7/1979 | Hsu | 357/23 |

OTHER PUBLICATIONS

Mochizuki et al., Proceed 7th Conf. Solid State Devices, Tokyo, 1975, pp. 41-48.
Matsushita et al., Proceed 7th Conf. Solid State Devices, Toyko, 1975, pp. 35-40.
DiMaria, Jour. of Appli. Phys. vol. 50, No. 9, Sep. 1979, pp. 5826-5829.

*Primary Examiner*—Martin H. Edlow
*Attorney, Agent, or Firm*—Birgit E. Morris; D. S. Cohen; Lawrence P. Benjamin

[57] ABSTRACT

An improved gate injected, floating gate memory device is described having improved charge retention and endurance characteristics is described in which the barrier height for the injection of charge (electrons or holes) into the floating gate is reduced. This is accomplished by utilizing a layer of semi-insulating polycrystalline silicon between the control electrode and the insulating layer over the floating gate.

8 Claims, 2 Drawing Figures

4,253,106

GATE INJECTED FLOATING GATE MEMORY DEVICE

BACKGROUND OF THE INVENTION

This invention relates, in general, to semiconductor devices and more particularly to a novel gate injected, electrically alterable, floating gate memory device.

In U.S. Pat. No. 4,162,504 which was filed on Dec. 27, 1977 and issued on July 24, 1979 and in a pending application Ser. No. 065,436 filed on Aug. 10, 1979, both assigned to the same assignee as the subject application, there is described various floating gate memory embodiments of metal-oxide-semiconductor (MOS) devices wherein current carriers are injected into the floating gate from the controlled gate as distinguished from the prior art which injects current carriers into the floating gate from the substrate. Both references are directed towards structures which produce non-volatile, electrically programmable Gate Injected MOS devices (GIMOS) and while the various embodiments detailed therein operate quite satisfactorily, it was found that the write/erase voltages of the GIMOS devices were only slightly (although significantly) lower than that of a Floating Gate Avalanche MOS (FAMOS) device while the charge retention and charge endurance characteristics of the GIMOS devices were vastly superior to those of the FAMOS devices. Aside from the difficulties detailed in the aforementioned references associated with the erasure of a single "word" in a FAMOS device, other serious defects become apparent. For example, there is a marked tendency towards zener breakdown at the drain-substrate junction particularly at high voltages. Further, since charge is placed on the floating gate by means of electrons or holes flowing through the thin layer of gate oxide material, it has been found that after a relatively few charge and discharge (write/erase) cycles the FAMOS device undergoes a radical change in threshold voltage which may require its replacement. It has been theorized that during transit of charge through the thin gate oxide layer, the layer is sufficiently disrupted to markedly change the threshold voltage.

Another memory device presently in the prior art in U.S. Pat. No. 4,104,657 which issued to D. J. DeMaria on Aug. 1, 1978. This last mentioned reference describes a structure wherein a relatively thick layer of thermally grown $SiO_2$ is formed over a silicon body having a drain and source wells formed therein. A number of graded layers of Semi-Insulating Polycrystalline Silicon (SIPOS) is then formed on the thick $SiO_2$ layer with each layer of SIPOS having an increasing excess of silicon content. Finally, the SIPOS layer is provided with a layer of aluminum (Al). It is stated that the charge (holes or electrons) will be trapped in the $SiO_2$ layer about 50 Angstroms from the Si-$SiO_2$ interface. However, this trapping phenomenon, as is obvious to those skilled in the art, is strongly dependent on how the thermally grown $SiO_2$ is processed. Practically speaking, even the slightest variation in production techniques, from run-to-run, will produce a slightly different quality of $SiO_2$. Hence, since trapping is so highly dependent on the processing techniques, threshold voltages as well as the density of the trapped charges and their location cannot be expected to be consistent from one production run to the next. Thus, the character of the $SiO_2$ will determine the depth to which the greatest density of trapped charges will be located. In any event, all charge injected will not be trapped in the thick, thermally grown $SiO_2$ but instead some charge will completely traverse the $SiO_2$ layer to be trapped in the underlying silicon layer. It is thus seen that neither the charge density nor the charge level will be consistent in this prior art device.

SUMMARY OF THE INVENTION

In accordance with the teachings of the invention, a memory device is described wherein the gate structure of a floating gate type memory device is modified to be provided with a layer of SIPOS in order to enhance the injection of charge from the control gate to the floating gate and to thereby accurately determine the location of the greatest density of charge trapped therein.

DETAILED DESCRIPTION OF THE INVENTION

Figure 1:
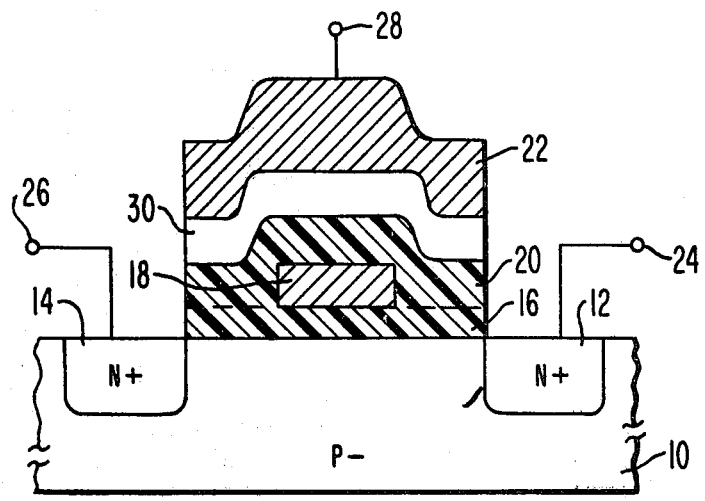
FIG. 1 is a cross-sectional view of one embodiment of a floating gate memory device constructed in accordance with the teaching of the present invention and using bulk silicon as the substrate.

Referring now to FIG. 1, one embodiment of our novel device is disclosed using bulk silicon as substrate 10 and having P type conductivity therein which may be of any type of crystallographic orientation. Within substrate 10, and at the surface thereof, there is a pair of opposite conductivity regions 12 and 14 having N type conductivity modifiers which represent the drain and source regions respectively. The drain and source may be formed either by diffusion or ion implantation in any one of the well-known manners available in the prior art. As is generally accepted in the art, source electrode 14 is the one into which majority carriers are introduced while drain 12 is the one from which majority carriers are derived. The channel region is defined by the inner extremities of the drain and source regions. The gate structure, as will be described, is formed over the channel region and consists of a first insulating layer 16 which may, for example, be a layer of thermally grown silicon oxide having a thickness of about 100–200 Angstroms. Floating gate 18 is formed on the thermally grown oxide layer 16 and may have a thickness of about 2000–3000 Angstroms. For a more detailed description of the relationship and the dimensions of the floating gate vis-a-vis the channel region attention is directed to U.S. Pat. No. 4,162,504 which reference is incorporated herein, in its entirety, by reference. Layer 16 is followed by a floating gate 18 which is covered by another oxide layer 20, a layer of SIPOS 30 and a polycrystalline silicon control electrode 22.

By way of example, floating gate 18 may be formed by first coating the entire surface of gate oxide layer 16 with a layer of polycrystalline silicon (polysilicon), masking the polycrystalline silicon layer to form the desired dimension and placement of floating gate 18 with respect to the channel region, and thereafter removing the unwanted portions of the polysilicon by means, for example, of a potassium hydroxide solution. The gate structure is then provided with another layer of thermally grown gate oxide 20 which is deployed over both floating gate 18 and gate oxide layer 16, to a thickness of about 700-800 Angstroms. Thus, those portions of oxide layer 16 not subtended by floating gate 18 will be combined with gate oxide 20 to from an insulating barrier about 900-1000 Angstroms thick.

The next step in the process is the deposition of SIPOS layer 30 which, ideally, would have a linear gradient. By linear gradient it is meant that the uppermost portion of layer 30, that is, the portion adjacent polysilicon layer 22, will be in the neighborhood of about 100 percent silicon while the portion of layer 30 adjacent the silicon dioxide layer 20 will be approximately 100 percent silicon dioxide. However, practically speaking, it is simpler, production-wise, to deposit the SIPOS in three sub-layers of about 150 Angstroms each. The first layer is deposited to a thickness of about 150 Angstroms and may have a concentration of about 30 percent silicon and 70 percent silicon dioxide. The second layer, also 150 Angstroms, may have a concentration of about 50 percent silicon and about 50 percent silicon dioxide while the third layer may have a concentration of 80-100 percent silicon and 20-0 percent silicon dioxide. One such method of forming pyrolytic oxide layers having an excess of silicon is described, for example, in U.S. Pat. No. 3,649,884. While we have here described the use of three pyrolytic layers of silicon dioxide or SIPOS and the thickness of each layer being about 150 angstroms, both the amount of excess silicon in each of the successive layers as well as the number of layers is a matter of design choice. Still another method of achieving grading of the pyrolytic oxide layers can be accomplished by the use of ion implantation, for example, at control depths after layer 30 has been deposited.

The processing of the gate structure is continued by depositing a layer of about 3000-5000 Angstroms of polysilicon using a chemical vapor deposition method as is well-known in the art, in order to form control gate 22. To complete the device, ohmic contacts are made to drain region 12, source region 14 and to control gate 22. These ohmic contacts are shown symbolically at 24, 26 and 28, respectively.

Figure 2:
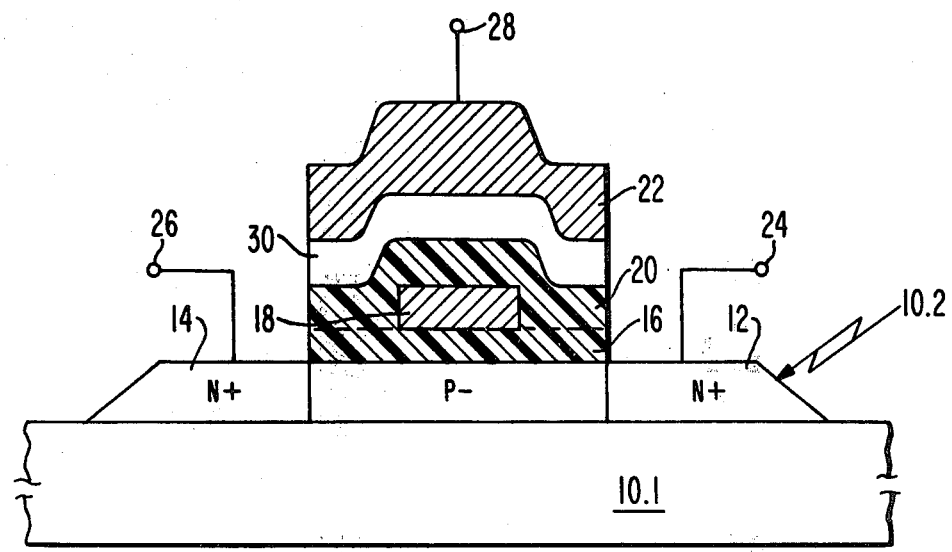
FIG. 2 is a cross-sectional view of another embodiment of the floating gate memory device constructed in accordance with the teachings of the present invention using a silicon-on-sapphire (SOS) substrate.

Referring now to FIG. 2, there is shown another embodiment of our invention utilizing the well-known Silicon-On-Sapphire (SOS) technique of forming a device. Further, it should be noted that similar elements in FIG. 2 will be numbered similarly to corresponding elements of FIG. 1. In this latter embodiment, an island of intrinsic silicon 10.2 is grown on a sapphire substrate 10.1 in any one of many well-known manners. After suitably masking and doping, again by any one of many well-known techniques, drain 12 and source 14 regions are formed with the channel region therebetween. As is usual in SOS devices, drain 12 and source 14 are of one conductivity type and the channel region is of an opposite conductivity. The channel region is made to extend between the inner extremities of drain region 12 and source region 14. As in the embodiment of FIG. 1, the gate structure is formed over the channel region and consists of a first insulating layer 16 such as, for example, thermally grown silicon oxide, having a thickness of about 100-200 Angstroms. After the formation of oxide layer 16 over the channel region, floating gate 18 is formed by first coating the entire exposed surface of gate oxide layer 16 with a layer of polysilicon using, for example, a CVD method. Thereafter, a layer of polysilicon is masked to form the desired dimension and the unwanted portions of polysilicon are removed utilizing a potassium hydroxide solution. The thus formed structure is now provided with a second layer of gate oxide 20 which is deployed to a thickness of about 700-800 Angstroms over floating gate 18. It should be noted that the oxide layer 20 is also deposited over the exposed portions of gate oxide layer 16 in order to completely encase and cover both floating gate 18 and those portions of gate oxide layer 16 not subtended by floating gate 18. Thus, the oxide thickness of layer 20 which lies directly above floating gate 18 will have a thickness of about 700-800 Angstroms while the thickness of layer 20 which lies beyond floating gate 18 and in direct contact with gate oxide 16 will have a thickness of about 900-1000 Angstroms. The gate structure is then completed by the formation of layer 30 as previously described with respect to FIG. 1 and, as in the previous embodiment, may be either a graded layer, or a multi-layer. Having formed SIPOS layer 30 atop of oxide layer 20 of the device is completed by the deposition of a layer of about 3000-5000 Angstroms of polysilicon in order to form control gate 22. Thereafter, ohmic contacts are made to drain 12, source 14 and control gate 22. These are shown symbolically at 24, 26 and 28, respectively.

While in the foregoing exegesis FIGS. 1 and 2 were described and shown in terms of structure of an N-channel device, it will be obvious to those skilled in the art that this is only by way of example since the conductivities of the various elements may be changed correspondingly without departing from the inventive concept. Similarly, while enhancement mode type devices are shown, depletion type devices having similar characteristics may be substituted to achieve the same results. Further, while the embodiment of FIG. 2 has been described using sapphire as the insulative substrate, it should be obvious that while sapphire is preferred, other similar materials such as spinel or monocrystalline beryllium oxide may be used with no deleterious effects.

It will now be appreciated by those skilled in the art that a structure having an aligned gate may also be formed. This may be accomplished by first appropriately doping substrate 10, FIG. 1 (island 10.2, FIG. 2) with P type conductivity modifiers. Thereafter, gate oxide 16 is grown, floating gate 18 is formed and layers 20, 30 and 22 are successively deposited or grown. Thereafter, the gate (channel region) is defined using layers of silicon nitride and photoresist as a mask to cover the gate (channel region). The layers under the unmasked areas are then successively removed in a well-known manner to expose the surface of substrate 10, FIG. 1 (island 10.2, FIG. 2). Thereafter, drain 12 and source 14 are formed with the channel region therebetween to form an aligned gate structure.

The floating gate device described in FIGS. 1 and 2, when constructed in accordance with the teachings herein, will thus provide the user with a floating gate device utilizing gate injection principles wherein all the holes injected through the gate will be trapped precisely at the floating gate. Thus, our device will be well controlled in that the trap site will no longer be strongly dependent on the processing of the silicon dioxide layer and more injected charge will be trapped at the control gate instead of being randomly trapped at about the 50 Angstrom level as suggested by the prior art. By providing a graded SIPOS layer between the control electrode and floating gate, the device is more easily written and more easily erased due to the lowered bandgap at the SIPOS-polysilicon interface. Since more charge is trapped or concentrated at the same, predictable level (from one production run to the next), both the charge retention and charge endurance characteristics will be vastly improved.

What is claimed is:

1. A floating gate storage device comprising:
   a body of semiconductor material having a pair of semiconductor regions of a first type of conductivity and spaced a given distance one from the other;
   an intermediate semiconductor region of an opposite type conductivity defining the space between the pair of regions;
   a first layer of insulating material having a given thickness disposed on the intermediate region;
   a floating gate member disposed over the intermediate region and insulated therefrom by the first layer of insulating material;
   a second layer of insulating material having a greater thickness than that of the first insulating layer disposed on both the floating gate member and those portions of the first insulating layer not covered by the floating gate member;
   a layer of semi-insulating polycrystalline silicon deposited on the second layer of insulating material above the intermediate region; and
   a control gate member, the width of which is the same as the given distance between the regions of first conductivity, disposed over the second insulating layer, above the intermediate region, and insulated from the floating gate member by the layer of semi-insulating polycrystalline silicon and the second layer of insulating material.

2. The floating gate storage device of claim 1, wherein:
   the body of semiconductor material is bulk silicon of the opposite type conductivity.

3. The floating gate storage device of claim 2, wherein:
   the semi-insulating polycrystalline silicon is a graded layer having an excess of silicon atoms and a minimum of oxygen atoms adjacent the control gate member and an excess of oxygen atoms and a minimum of silicon atoms adjacent the floating gate member.

4. The floating gate storage device of claim 3, wherein:
   the semi-insulating layer consists of a plurality of sublayers, each sublayer having a different level of silicon and oxygen atoms therein:
   the sublayer adjacent the control gate member having the highest level of silicon atoms and the lowest level of oxygen atoms; the sublayer adjacent the floating gate member having the highest level of oxygen atoms and the lowest level of silicon atoms.

5. The floating gate storage device of claim 1, wherein:
   the pair of spaced regions and the intermediate region are colocated in an island of silicon formed on an insulative substrate.

6. The floating gate storage device of claim 5, wherein:
   the insulative substrate is selected from the group consisting of sapphire, spinel, and monocrystalline beryllium oxide.

7. The floating gate storage device of claim 6, wherein:
   the semi-insulating polycrystalline silicon is a graded layer having an excess of silicon atoms and a minimum of oxygen atoms adjacent the control gate member and an excess of oxygen atoms and a minimum of silicon atoms adjacent the floating gate member.

8. The floating gate storage device of claim 7, wherein:
   the semi-insulating layer consists of a plurality of sublayers, each sublayer having a different level of silicon and oxygen atoms therein:
   the sublayer adjacent the control gate member having the highest level of silicon atoms and the lowest level of oxygen atoms; the sublayer adjacent the floating gate member having the highest level of oxygen atoms and the lowest level of silicon atoms.

* * * * *